US009559332B2

(12) United States Patent
Lee et al.

(10) Patent No.: US 9,559,332 B2
(45) Date of Patent: Jan. 31, 2017

(54) ORGANIC ELECTROLUMINESCENCE DISPLAY PANEL STRUCTURED TO REDUCE OR PREVENT OUTGASSING FROM AN ORGANIC MATERIAL, AND DISPLAY DEVICE INCLUDING THE SAME

(71) Applicant: SAMSUNG DISPLAY CO., LTD., Yongin, Gyeonggi-Do (KR)

(72) Inventors: Sung Soo Lee, Suwon-si (KR); Ok Keun Song, Hwaseong-si (KR); Young Mo Koo, Suwon-si (KR); Se Il Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 473 days.

(21) Appl. No.: 13/943,685

(22) Filed: Jul. 16, 2013

(65) Prior Publication Data

US 2014/0078120 A1    Mar. 20, 2014

(30) Foreign Application Priority Data

Sep. 14, 2012   (KR) .................. 10-2012-0102278

(51) Int. Cl.
*H01L 51/52*   (2006.01)
*G09G 3/30*   (2006.01)
*H01L 27/32*   (2006.01)

(52) U.S. Cl.
CPC ............ *H01L 51/5253* (2013.01); *G09G 3/30* (2013.01); *H01L 27/3258* (2013.01)

(58) Field of Classification Search
CPC .................................................. H01L 51/5253
See application file for complete search history.

(56) References Cited

U.S. PATENT DOCUMENTS

2005/0077816 A1* 4/2005 Yamada .............. H01L 51/5228
                                                                  313/503
2006/0022587 A1* 2/2006 Jeong .................. H01L 27/3246
                                                                  313/504

FOREIGN PATENT DOCUMENTS

| KR | 10-2001-0112623 | 12/2001 |
| KR | 10-2005-0074208 | 7/2005 |
| KR | 10-2005-0122893 | 12/2005 |
| KR | 1020050122893 | * 12/2005 |
| KR | 10-2010-0131800 | 12/2010 |
| KR | 1020100131800 | * 12/2010 |

* cited by examiner

*Primary Examiner* — Joseph Feild
*Assistant Examiner* — Karin Kiyabu
(74) *Attorney, Agent, or Firm* — Lewis Roca Rothgerber Christie LLP

(57) ABSTRACT

An organic electroluminescence (EL) display panel includes a substrate, a thin film transistor on the substrate, an overcoat layer on the thin film transistor and containing an organic material, a first electrode on the overcoat layer, an organic light emitting layer on the first electrode, a second electrode on the organic light emitting layer, and a barrier layer between the overcoat layer and the first electrode and including a first region formed of a single layer and a second region formed of a multilayer.

16 Claims, 10 Drawing Sheets

ORGANIC ELECTROLUMINESCENCE DISPLAY PANEL STRUCTURED TO REDUCE OR PREVENT OUTGASSING FROM AN ORGANIC MATERIAL, AND DISPLAY DEVICE INCLUDING THE SAME

CROSS-REFERENCE TO RELATED APPLICATION

This application claims priority to and the benefit of Korean Patent Application No. 10-2012-0102278 filed on Sep. 14, 2012 in the Korean Intellectual Property Office, the disclosure of which is incorporated herein by reference in its entirety.

BACKGROUND

1. Field

The present invention relates to an organic electroluminescence (EL) display panel and a display device including the same.

2. Description of the Related Art

As portable display devices (such as notebooks, mobile phones and portable media players (PMPs)) as well as display devices for homes (such as TVs and monitors) become lighter and thinner, various flat panel display devices are being used. A flat panel display device includes a display panel which displays images. Flat panel display devices may be referred to as liquid crystal display devices, organic electroluminescence (EL) display devices, and electrophoretic display devices according to the type of the display panel.

An organic EL display device includes an organic EL display panel. The organic EL display panel includes an organic light emitting layer which is disposed between a first electrode and a second electrode and emits light corresponding to a current flowing therethrough. The organic EL display panel includes a thin film transistor connected to the first electrode or the second electrode and controls the current flowing through the organic light emitting layer using the thin film transistor. An overcoat layer may be disposed between the thin film transistor and the first or second electrode connected to the thin film transistor in order to planarize a top surface of the thin film transistor.

The organic light emitting layer may emit red light, blue light, or green light according to the type of the organic EL display panel. Otherwise, the organic light emitting layer may emit white light. If the organic light emitting layer emits the white light, the organic EL display panel may further include a color filter.

SUMMARY

Aspects of embodiments according to the present invention provide an organic electroluminescence (EL) display panel (i.e., an organic light emitting display panel) structured to reduce or prevent outgassing from an organic material and a display device including the organic EL display panel.

Aspects of embodiments according to the present invention also provide an organic EL display panel structured to reduce or prevent outgassing from an organic material and degradation of color reproducibility due to resonance, and a display device including the organic EL display panel.

However, aspects of the present invention are not limited to the aspects and embodiments set forth herein. The above and other aspects of the present invention will become more apparent to one of ordinary skill in the art to which the present invention pertains by referencing the detailed description of embodiments according to the present invention given below.

In one embodiment according to the present invention, an organic electroluminescence (EL) display panel is provided. The organic EL display panel includes: a substrate; a thin film transistor on the substrate; an overcoat layer on the thin film transistor and including an organic material; a first electrode on the overcoat layer; an organic light emitting layer on the first electrode; a second electrode on the organic light emitting layer; and a barrier layer between the overcoat layer and the first electrode, and including a first region including a single layer and a second region including a multilayer.

The first electrode may include a transparent electrode, and the second electrode may include a reflective electrode.

The display panel may further include a pixel defining layer on the barrier layer, wherein the first region is disposed under a light emitting region in which the light emitting layer is exposed by the pixel defining layer.

The second region may not be located under the light emitting region.

The display panel may further include a color filter located under the light emitting region and the barrier layer.

The overcoat layer may have a contact hole which overlaps the first electrode, and the second region may be located adjacently to the contact hole.

The second region may be located on an inner surface of a wall of the contact hole.

The first electrode may include a reflective electrode, and the second electrode may include a transparent electrode.

The display panel may further include a color filter located above the organic light emitting layer to overlap the organic light emitting layer.

The barrier layer may include: a first barrier layer at the first region and the second region; and a second barrier layer at the second region and including a different material from the first barrier layer.

In another embodiment according to the present invention, a display device includes: an organic EL display panel; and a driver configured to drive the organic EL display panel. The organic EL display panel includes: a substrate; a thin film transistor on the substrate; an overcoat layer on the thin film transistor and including an organic material; a first electrode on the overcoat layer; an organic light emitting layer on the first electrode; a second electrode on the organic light emitting layer; and a barrier layer between the overcoat layer and the first electrode, and including a first region including a single layer and a second region including a multilayer.

The first electrode may include a transparent electrode, and the second electrode may include a reflective electrode.

The organic EL display panel may further include a pixel defining layer on the barrier layer, wherein the first region may be located under a light emitting region in which the light emitting layer is exposed by the pixel defining layer.

The second region may not be located under the light emitting region.

The organic EL display panel may further include a color filter located under the light emitting region and the barrier layer.

The overcoat layer may have a contact hole which overlaps the first electrode, and the second region may be located adjacently to the contact hole.

The second region may be located on an inner surface of a wall of the contact hole.

The first electrode may include a reflective electrode, and the second electrode may include a transparent electrode.

The organic EL display panel may further include a color filter located above the organic light emitting layer to overlap the organic light emitting layer.

The barrier layer may include: a first barrier layer at the first region and the second region; and a second barrier layer at the second region and including a different material from the first barrier layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Figure 1:
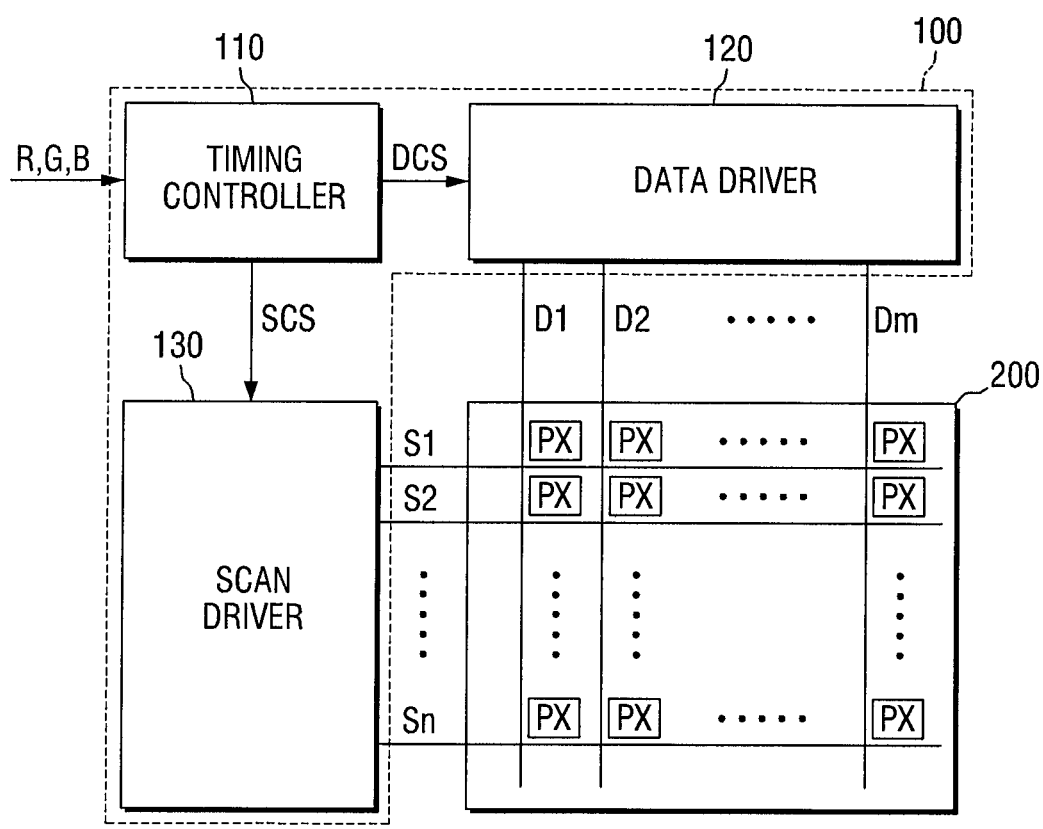
FIG. 1 is a block diagram of a display device according to an embodiment of the present invention.

Features and aspects of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the scope of the present invention will be defined by the appended claims and their equivalents. Thus, in some embodiments, well-known structures and devices are not shown in order not to obscure the description of the embodiments with unnecessary detail. Like reference numerals refer to like elements throughout. In the drawings, the thickness of layers and regions may be exaggerated for clarity.

It will be understood that when an element or layer is referred to as being "on" or "connected to" another element or layer, it can be directly on or connected to the other element or layer or intervening elements or layers may be present. When an element is referred to as being "directly on" or "directly connected to" another element or layer, there may be no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are used to distinguish one element from another element. Thus, for example, a first element, a first component or a first section discussed below could be termed a second element, a second component or a second section without departing from the teachings of the present invention.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described in reference to plan views and/or cross-sectional views by way of ideal schematic views of the embodiments of the present invention. Accordingly, the example views may be modified depending on manufacturing technologies and/or tolerances. Therefore, the embodiments of the present invention are not limited to those shown in the views, but include modifications in configuration formed on the basis of manufacturing processes. Therefore, regions that are illustrated as examples in figures have schematic properties and shapes of regions corresponding to specific shapes of regions of elements by way of example, and do not limit aspects of the present invention.

An overcoat layer and/or the color filter in an organic EL device (e.g., an organic light emitting display device) may contain an organic material. In the process of depositing the first electrode or the second electrode at a high temperature, outgassing may occur from the organic material. The outgassing increases surface resistance of the first or second electrode, thereby deteriorating characteristics of a device while contracting (i.e., reducing the size of) a pixel and shortening the life of the organic light emitting layer.

Hereinafter, embodiments of the present invention will be described in further detail with reference to the accompanying drawings.

FIG. 1 is a block diagram of a display device 1000 according to an embodiment of the present invention.

Referring to FIG. 1, the display device 1000 includes a driver 100 and an organic electroluminescence (EL) display panel 200.

The driver 100 may drive the organic EL display panel 200. The driver 100 may receive image data R, G, B, generate scan signals S1 through Sn and data signals D1 through Dm, which correspond to the received image data R, G, B, to drive the organic EL display panel 200, and provide the scan signals S1 through Sn and the data signals D1 through Dm to the organic EL display panel 200.

The driver 100 may include a timing controller 110, a data driver 120, and a scan driver 130. The timing controller 110, the data driver 120 and the scan driver 120 may be formed as a single integrated circuit. However, the present invention is not limited thereto, and they can also be formed as discrete (or separate) integrated circuits.

The timing controller 110 may receive the image data R, G, B and generate a scan driver control signal SCS and a data driver control signal DCS which correspond to the image data R, G, B.

The data driver 120 may receive the data driver control signal DCS and generate the data signals D1 through Dm corresponding to the data driver control signal DCS. The data signals D1 through Dm may include information about gray levels of an image to be displayed on the organic EL display panel 200.

The scan driver 130 may receive the scan driver control signal SCS and generate the scan signals S1 through Sn corresponding to the scan driver control signal SCS. The scan signals S1 through Sn may control times at which the data signals D1 through Dm are transmitted to a plurality of pixels PX of the organic EL display panel 200, respectively.

The organic EL display panel 200 may receive the data signals D1 through Dm and the scan signals S1 through Sn, and may display an image corresponding to the data signals D1 through Dm and the scan signals S1 through Sn. The organic EL display panel 200 may include a plurality of pixels PX. The pixels PX may be arranged in a matrix. The pixels PX may be illuminated at gray levels corresponding to the data signals D1 through Dm, and the scan signals S1 through Sn may control the times at which the data signals D1 through Dm are transmitted to the pixels PX, respectively.

Figure 2:
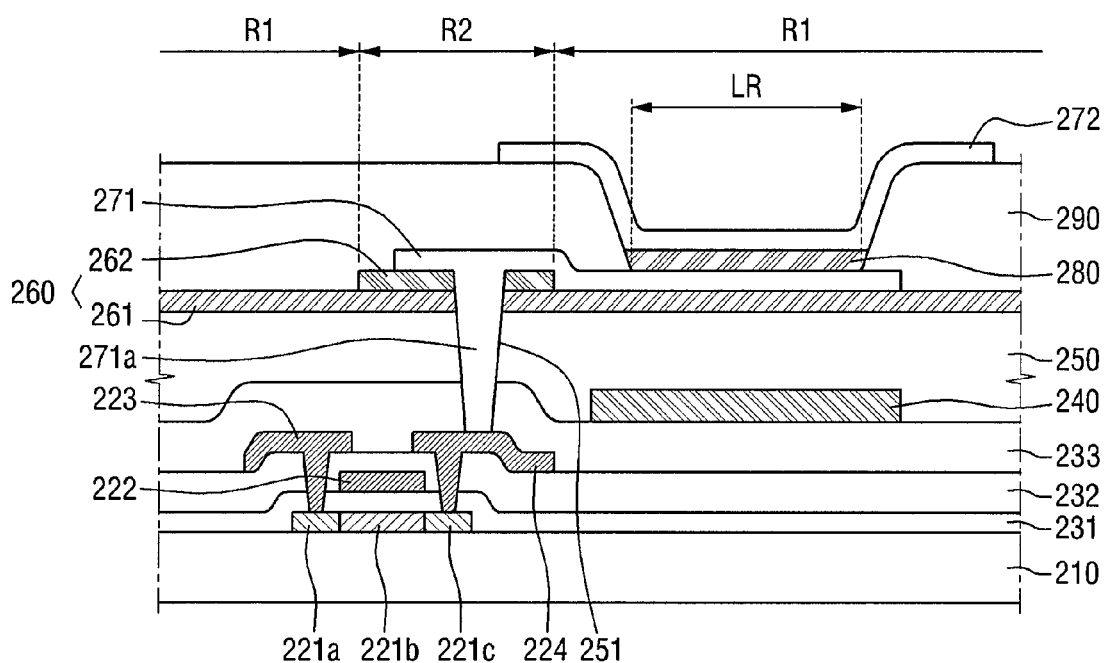
FIG. 2 is a cross-sectional view of an organic electroluminescence (EL) display panel according to an embodiment of the present invention.

The organic EL display panel 200 will now be described in more detail with reference to FIG. 2. FIG. 2 is a cross-sectional view of an organic EL display panel 200 according to an embodiment of the present invention. More specifically, FIG. 2 is a cross-sectional view of one pixel PX of the organic EL display panel 200 and an area around the pixel PX.

Referring to FIG. 2, the organic EL display panel 200 includes a thin film transistor, an overcoat layer 250, a first electrode 271, an organic light emitting layer 280, a second electrode 272, and a barrier layer 260.

A substrate 210 may be made of a transparent material. For example, the substrate 210 may be made of, but is not limited to, glass, polyethylene terephthalate (PET), polycarbonate (PC), polyethersulfone (PES), polyimide (PI), or polymethylmethacrylate (PMMA).

The thin film transistor may be disposed on the substrate 210. The thin film transistor may include a semiconductor layer 221a through 221c, a gate electrode 222, a source electrode 223, and a drain electrode 224.

The semiconductor layer 221a through 221c may include a source region 221a, a channel region 221b, and a drain region 221c. The source region 221a may be connected to the source electrode 223, and the drain region 221c may be connected to the drain electrode 224. The channel region 221b may be disposed between the source region 221a and the drain region 221c. A channel may be formed in the channel region 221b by a voltage applied to the gate electrode 222. When the channel is formed in the channel region 221b, the source region 221a and the drain region 221c may be electrically connected to each other. Although not shown in the drawing, the organic EL display panel 200 may further include a buffer layer between the substrate 210 and the semiconductor layer 221a through 221c to prevent the introduction of foreign matter from the substrate 210.

The gate electrode 222 may be disposed on the semiconductor layer 221a through 221c. The gate electrode 222 may overlap the channel region 221b. One of the scan signals S1 through Sn may be transmitted to the gate electrode 222, and a voltage corresponding to the transmitted scan signal may be applied to the gate electrode 222, thereby controlling the thin film transistor to be turned on or off. The organic EL display panel 200 may further include a gate insulating film 231 between the gate electrode 222 and the semiconductor layer 221a through 221c. The gate insulating film 231 may insulate the gate electrode 222 from the semiconductor layer 221a through 221c. The organic EL display panel 200 may further include an interlayer insulating film 232 on the gate electrode 222.

The source electrode 223 and the drain electrode 224 may be connected to the source region 221a and the drain region 221c, respectively. The source electrode 223 and the drain electrode 224 may respectively be connected to the source region 221a and the drain region 221c by contact holes formed in the gate insulating film 231 and the interlayer insulating film 232.

The arrangement of the elements 221a through 221c and 222 through 224 of the thin film transistor shown in FIG. 2 is provided as merely an embodiment. Those with ordinary skill in the art would appreciate that the arrangement of the elements 221a through 221c and 222 through 224 of the thin film transistor can be modified variously according to embodiments.

The overcoat layer 250 may be disposed on the thin film transistor. The overcoat layer 250 may have a flat top surface such that other elements can be easily placed on the overcoat layer 250. The overcoat layer 250 may contain an organic material. The overcoat layer 250 may include a contact hole 251. The first electrode 271 may be connected to an element disposed under the overcoat layer 250 by the contact hole 251. For example, the first electrode 271 may be connected to the drain electrode 224 by the contact hole 251. When the first electrode 271 is deposited at a high temperature, outgassing may occur from the organic material contained in the overcoat layer 250. The outgassing increases surface resistance of the first electrode 271, thereby degrading characteristics of a device while contracting the pixel PX and shortening the life of the organic light emitting layer 280. The contact hole 251 may function as a major path through which an outgas is released. The barrier layer 260 included in the organic EL display panel 200 can reduce negative effects brought about by the outgassing. Since the barrier layer 260 is formed around the contact hole 251 which is a major path for the release of the outgas, it can block the outgassing more effectively.

The first electrode 271 may be disposed on the overcoat layer 250. The first electrode 271 may include a connecting portion 271a which extends downward to be connected to the drain electrode 224. The connecting portion 271a may be disposed in the contact hole 251. The first electrode 271 may be made of a transparent conductive material such as indium tin oxide (ITO), indium zinc oxide (IZO), ZnO, or $SnO_2$. The first electrode 271 may be formed by high-temperature deposition, and outgassing may occur in the process of depositing the first electrode 271 at a high temperature.

The organic light emitting layer 280 may be disposed on the first electrode 271. The organic light emitting layer 280 may emit light at a gray level corresponding to a potential difference between the first electrode 271 and the second electrode 272 or a current flowing through the organic light emitting layer 280. The organic light emitting layer 280 may emit white light. However, the present invention is not limited thereto. Light generated by the organic light emitting layer 280 may be emitted toward the bottom of the substrate 210.

The second electrode 272 may be disposed on the organic light emitting layer 280. The second electrode 272 may be made of a reflective conductive material. The second electrode 272 may reflect light coming from the organic light emitting layer 280 in a downward direction.

The barrier layer 260 may be disposed between the overcoat layer 250 and the first electrode 271. The barrier layer 260 may be made of SiOx or SiNx. The barrier layer 260 hinders an outgas generated by the organic material of the overcoat layer 250 from being released upward from the overcoat layer 250. Therefore, the barrier layer 260 can reduce effects caused by outgassing.

The barrier layer 260 may include a first region R1 formed of a single layer and a second region R2 formed of a multilayer (i.e., multiple layers, or two or more layers stacked together). In FIG. 2, the second region R is a double layer. However, this is merely an example, and the second region R2 can also be formed of a triple or quadruple layer. The second region R2 may be disposed adjacent to a major path for the release of an outgas. For example, the second region R2 may be disposed around the contact hole 251. If the second region R2 formed of a multilayer is disposed adjacent to the major path for the release of the outgas, it can better block the outgas. Thus, the second region R2 can more effectively hinder the outgas from being released upward from the overcoat layer 250. In addition, since only part of the barrier layer 260 is composed of multiple layers, a thickness of the organic EL display panel 200 can be reduced compared with cases in which the entire barrier layer 260 is composed of multiple layers.

The first region R1 may be disposed under a light emitting region LR in which light generated from the organic light emitting layer 280 can travel downward from the organic light emitting layer 280. The second region R2 may not be disposed under the light emitting region LR. When the barrier layer 260 composed of multiple layers is disposed under the light emitting region LR, light emitted from the organic light emitting layer 280 is more likely to be reflected due to a difference in refractive index between the multiple layers than when the barrier layer 260 composed of a single layer is disposed under the light emitting region LR. The light reflected by the barrier layer 260 composed of the multiple layers can be reflected again by the second electrode 272. In this process, resonance of light may occur between the second electrode 272 and the barrier layer 260 composed of the multiple layers. The resonance of the light between the second electrode 272 and the barrier layer 260 composed of the multiple layers may affect the wavelength of emitted light, thereby degrading color reproducibility of the display device 1000. In the organic EL display panel 200, however, the first region R1 having a single layer is disposed under the light emitting region LR. Thus, this can reduce or prevent the resonance between the second electrode 272 and the barrier layer 260 and the degradation of the color reproducibility of the display device 1000.

The barrier layer 260 may include a first barrier layer 261 and a second barrier layer 262. The first barrier layer 261 may be disposed on the entire top surface of the overcoat layer 250. The second barrier layer 262 may be disposed on a selected region of the first barrier layer 261. In this case, after the first barrier layer 261 is disposed on the entire top surface of the overcoat layer 250, the second barrier layer 262 may be disposed on the selected region of the first barrier layer 261, thereby completing the barrier layer 260. A region in which the second barrier layer 262 overlaps the first barrier layer 261 may be defined as the second region R2. The first barrier layer 261 and the second barrier layer 262 may be made of different materials. For example, the first barrier layer 261 may be made of SiOx, and the second barrier layer 262 may be made of SiNx. The opposite is also possible, and the present invention is not limited to either embodiment.

The organic EL display panel 200 may further include a protective film 233 disposed on the thin film transistor. The protective film 233 may protect the thin film transistor.

The organic EL display panel 200 may further include a color filter 240. The color filter 240 may be disposed under the barrier layer 260 to be overlapped by the light emitting region LR. In FIG. 2, the color filter 240 is disposed on a top surface of the protective film 233. However, the present invention is not limited thereto. The color filter 240 may have any one of, but is not limited to, red, green and blue colors. The color filter 240 may contain an organic material. The organic material contained in the color filter 240 may experience outgassing in the process of manufacturing the organic EL display panel 200. The barrier layer 260 included in the organic EL display panel 200 can hinder an outgas emitted from the color filter 240 from travelling to above the barrier layer 260.

The organic EL display panel 200 may further include a pixel defining layer 290. The pixel defining layer 290 may be disposed on the barrier layer 260 and the first electrode 271. The pixel defining layer 290 may define the area of each of the pixels PX included in the organic EL display panel 200. The pixel defining layer 290 may form an aperture which exposes at least a part of the first electrode 271. The organic light emitting layer 280 and the second electrode 272 may be disposed in the aperture of the pixel defining layer 290. A region of the aperture (in which the pixel defining layer 290 is not disposed) which exposes the organic light emitting layer 280 may be defined as the light emitting region LR.

Figure 3:
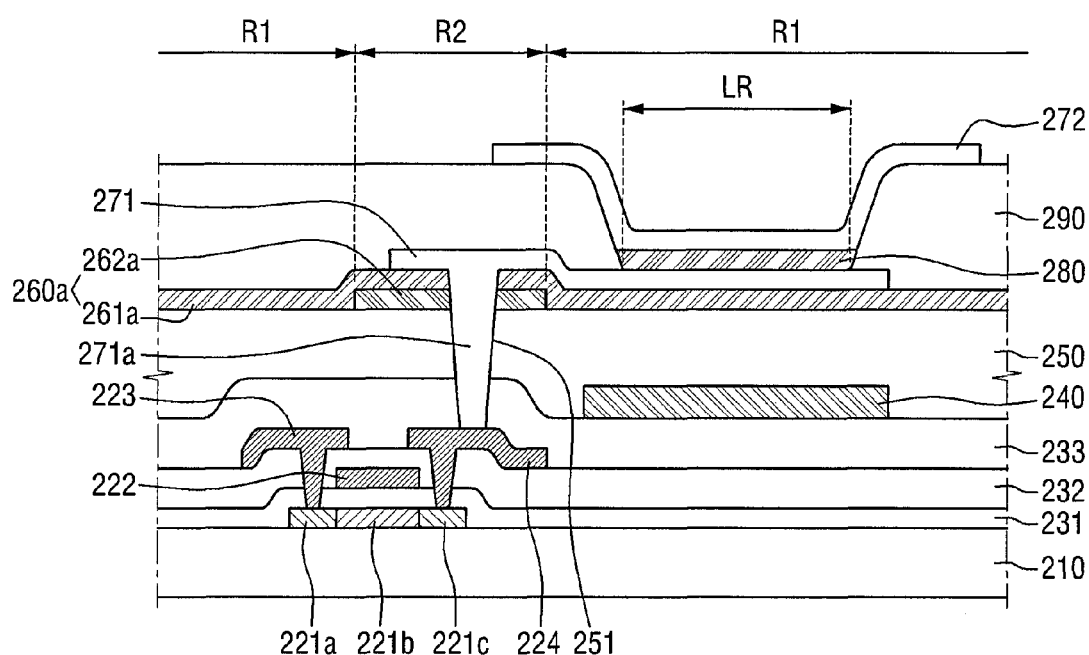
FIG. 3 is a cross-sectional view of an organic EL display panel according to another embodiment of the present invention.

Another embodiment of the present invention will now be described with reference to FIG. 3. FIG. 3 is a cross-sectional view of an organic EL display panel 200a according to another embodiment of the present invention.

Referring to FIG. 3, the organic EL display panel 200a may include a barrier layer 260a. The barrier layer 260a may include a first barrier layer 261a and a second barrier layer 262a. The first barrier layer 261a may be disposed on the second barrier layer 262a. In this case, after the second barrier layer 262a is disposed on a selected region of an overcoat layer 250, the first barrier layer 261a may be disposed on the overcoat layer 250 and the entire surface of the second barrier layer 262a, thereby completing the barrier layer 260a.

For simplicity, other elements substantially identical to those of FIG. 2 are indicated by like reference numerals, and thus their description will be omitted.

Figure 4:
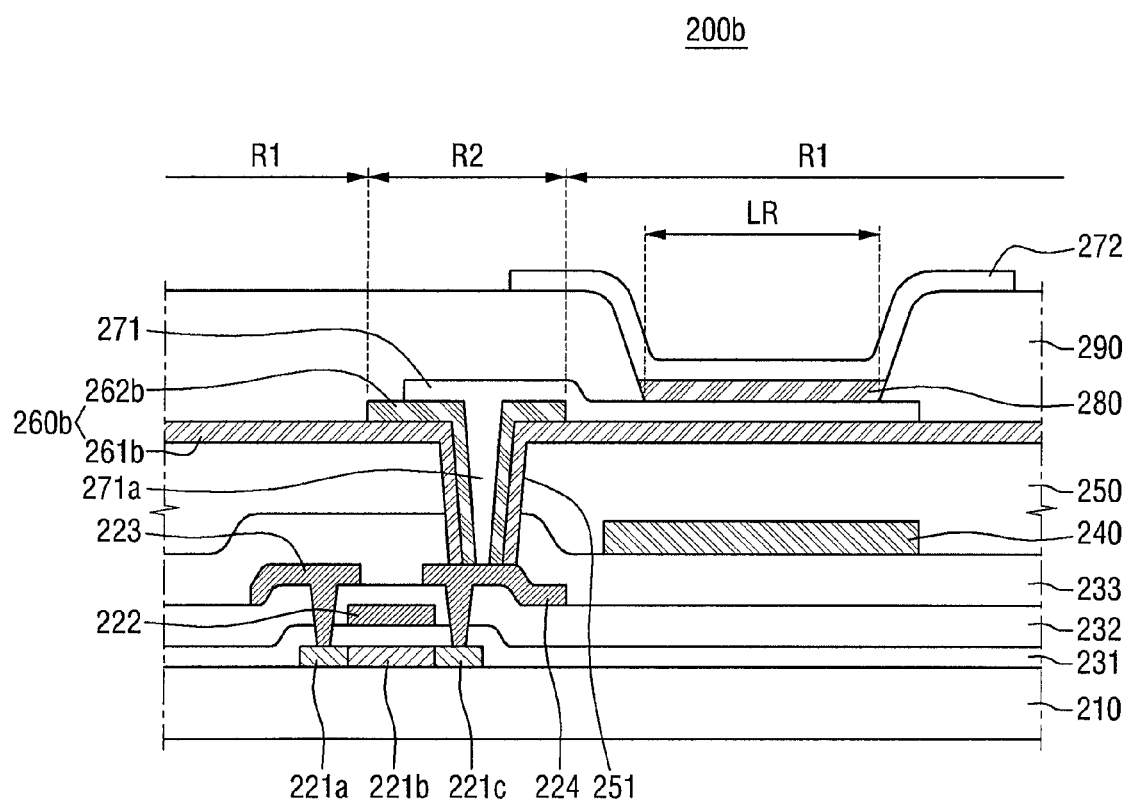
FIG. 4 is a cross-sectional view of an organic EL display panel according to another embodiment of the present invention.

Another embodiment of the present invention will now be described with a reference to FIG. 4. FIG. 4 is a cross-sectional view of an organic EL display panel 200b according to another embodiment of the present invention.

Referring to FIG. 4, the organic EL display panel 200b may include a barrier layer 260b. The barrier layer 260b may be disposed on an inner surface of a wall (e.g., a cylindrical wall or one or more cuboidal walls) of a contact hole 251. Specifically, after the contact hole 251 is formed in an overcoat layer 250, the barrier layer 260b may be formed on the inner surface of the wall of the contact hole 251. The barrier layer 260b disposed on the inner surface of the wall of the contact hole 251 can reduce or prevent the release of an outgas not only through a top surface of the overcoat layer 250 but also through the inner surface of the wall of the contact hole 251.

The barrier layer 260b may include a first barrier layer 261b and a second barrier layer 262b. The first barrier layer 261b may be disposed on the entire top surface of the overcoat layer 250 and be adjacent to the inner surface of the wall of the contact hole 251. The second barrier layer 262b may be disposed on a selected region of the first barrier layer 261b. After the first barrier layer 261b is disposed, the second barrier layer 262b may be disposed, thereby completing the barrier layer 260b.

For simplicity, other elements substantially identical to those of FIG. 2 are indicated by like reference numerals, and thus their description will be omitted.

Figure 5:
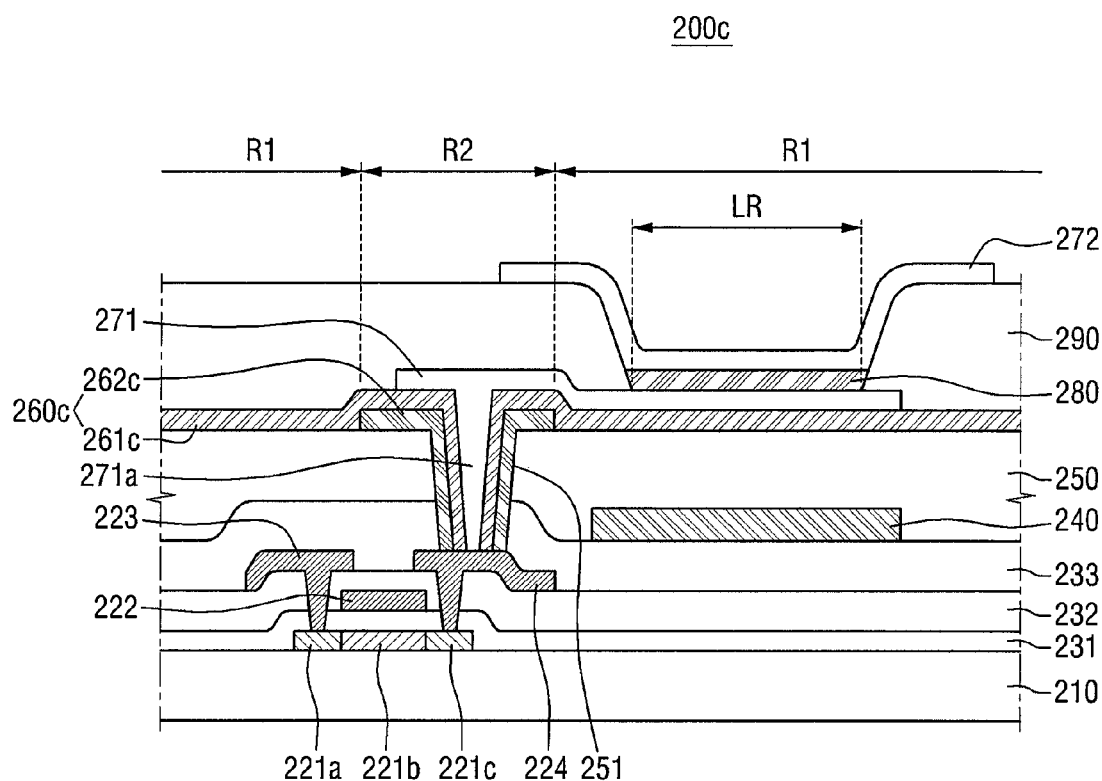
FIG. 5 is a cross-sectional view of an organic EL display panel according to another embodiment of the present invention.

Another embodiment of the present invention will now be described with reference to FIG. 5. FIG. 5 is a cross-sectional view of an organic EL display panel 200c according to another embodiment of the present invention.

Referring to FIG. 5, the organic EL display panel 200c may include a barrier layer 260c. The barrier layer 260c may be disposed on an inner surface of a wall of a contact hole 251. The barrier layer 260c disposed on the inner surface of the wall of the contact hole 251 can reduce or prevent the release of an outgas not only through a top surface of an overcoat layer 250 but also through the inner surface of the wall of the contact hole 251.

The barrier layer 260c may include a first barrier layer 261c and a second barrier layer 262c. The second barrier layer 262c may be disposed on a selected region of the top surface of the overcoat layer 250. When the second barrier layer 262c is disposed adjacent to the contact hole 251, it may also be disposed in a region adjacent to the inner surface of the wall of the contact hole 251. After the second barrier layer 262c is disposed, the first barrier layer 261c may be disposed on the entire top surface of the overcoat layer 250 and the second barrier layer 262c.

For simplicity, other elements substantially identical to those of FIG. 2 are indicated by like reference numerals, and thus their description will be omitted.

Figure 6:
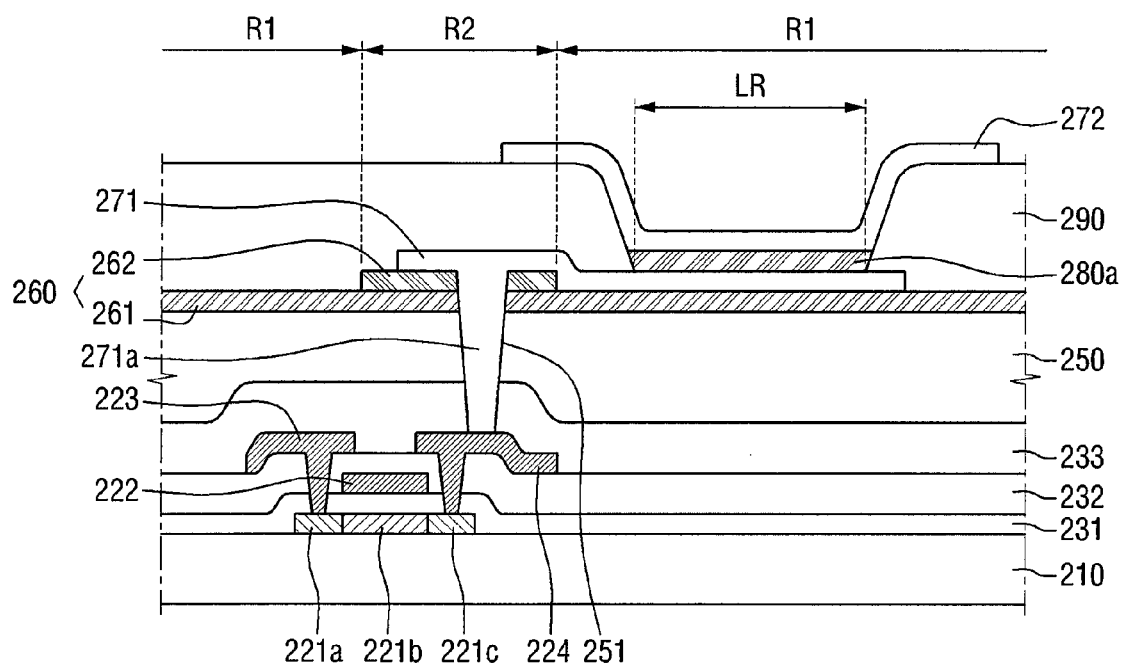
FIG. 6 is a cross-sectional view of an organic EL display panel according to another embodiment of the present invention.

Another embodiment of the present invention will now be described with reference to FIG. 6. FIG. 6 is a cross-sectional view of an organic EL display panel 200d according to another embodiment of the present invention.

Referring to FIG. 6, the organic EL display panel 200d may include an organic light emitting layer 280a. The organic light emitting layer 280a may emit light at a gray level corresponding to a potential difference between a first electrode 271 and a second electrode 272 or a current flowing through the organic light emitting layer 280a. The organic light emitting layer 280a may emit any one of red light, blue light, and green light. If the organic light emitting layer 280a emits any one of the red light, the blue light and the green light, the color filter 240 of the organic EL display panel 200 shown in FIG. 2 may be omitted from the organic EL display panel 200d.

For simplicity, other elements substantially identical to those of FIG. 2 are indicated by like reference numerals, and thus their description will be omitted.

Figure 7:
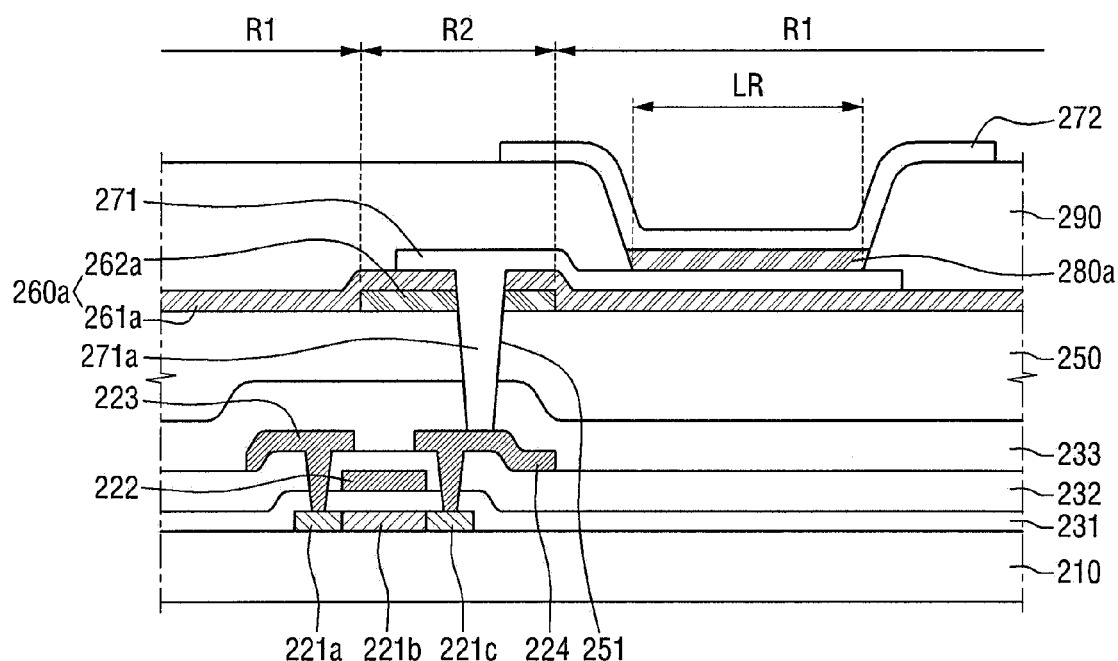
FIG. 7 is a cross-sectional view of an organic EL display panel according to another embodiment of the present invention.
Figure 8:
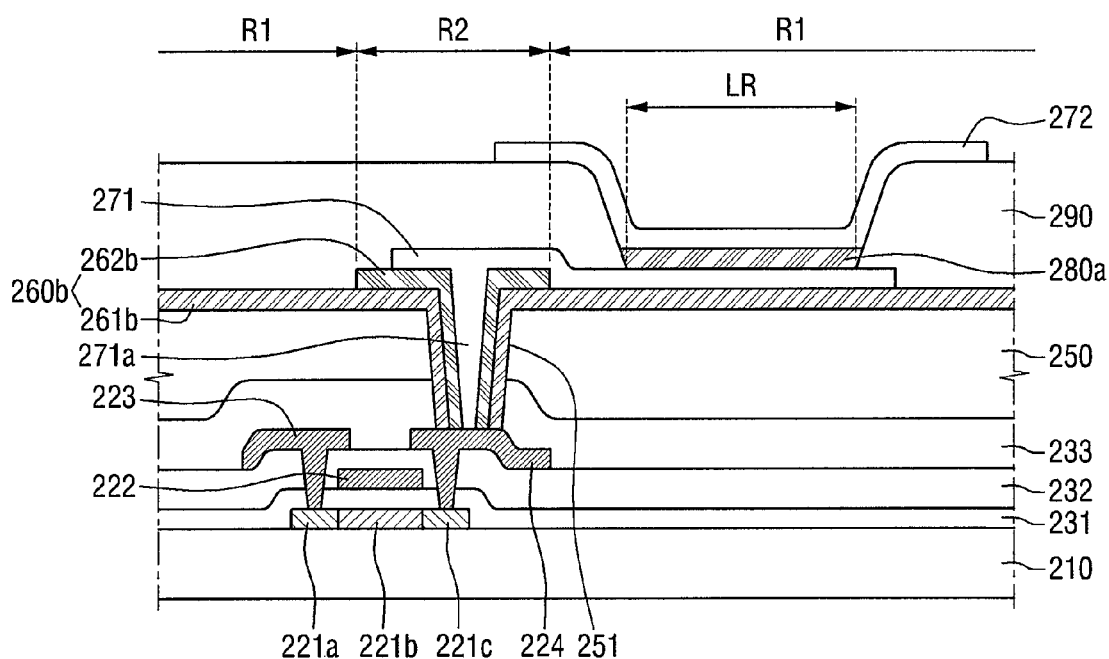
FIG. 8 is a cross-sectional view of an organic EL display panel according to another embodiment of the present invention.
Figure 9:
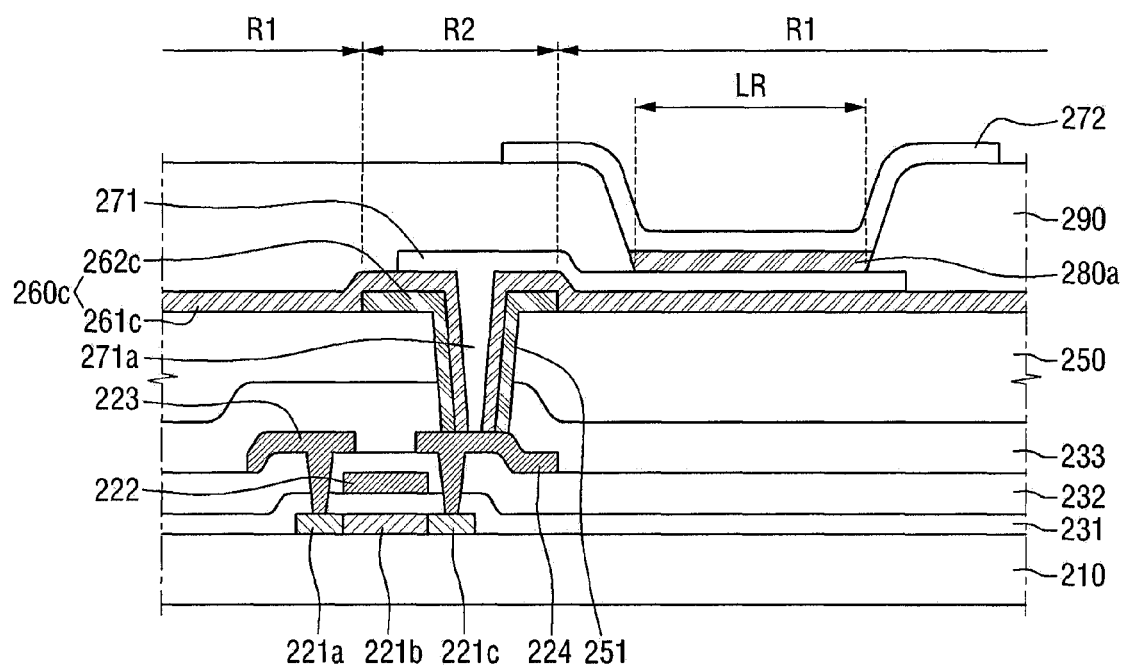
FIG. 9 is a cross-sectional view of an organic EL display panel according to another embodiment of the present invention.

Organic EL display panels according to other embodiments of the present invention will now be described with reference to FIGS. 7 through 9. FIG. 7 is a cross-sectional view of an organic EL display panel 200e according to another embodiment of the present invention. FIG. 8 is a cross-sectional view of an organic EL display panel 200f according to another embodiment of the present invention. FIG. 9 is a cross-sectional view of an organic EL display panel 200g according to another embodiment of the present invention.

In each of the organic EL display panels 200e through 200g of FIGS. 7 through 9, the organic light emitting layer 280 of each of the organic EL display panels 200a through 200c of FIGS. 3 through 5 is replaced with an organic light emitting layer 280a, and the color filter 240 is omitted.

For simplicity, other elements of the organic EL display panels 200e through 200g are substantially identical to those with the same names in FIGS. 3 through 5, and thus their description will be omitted.

Figure 10:
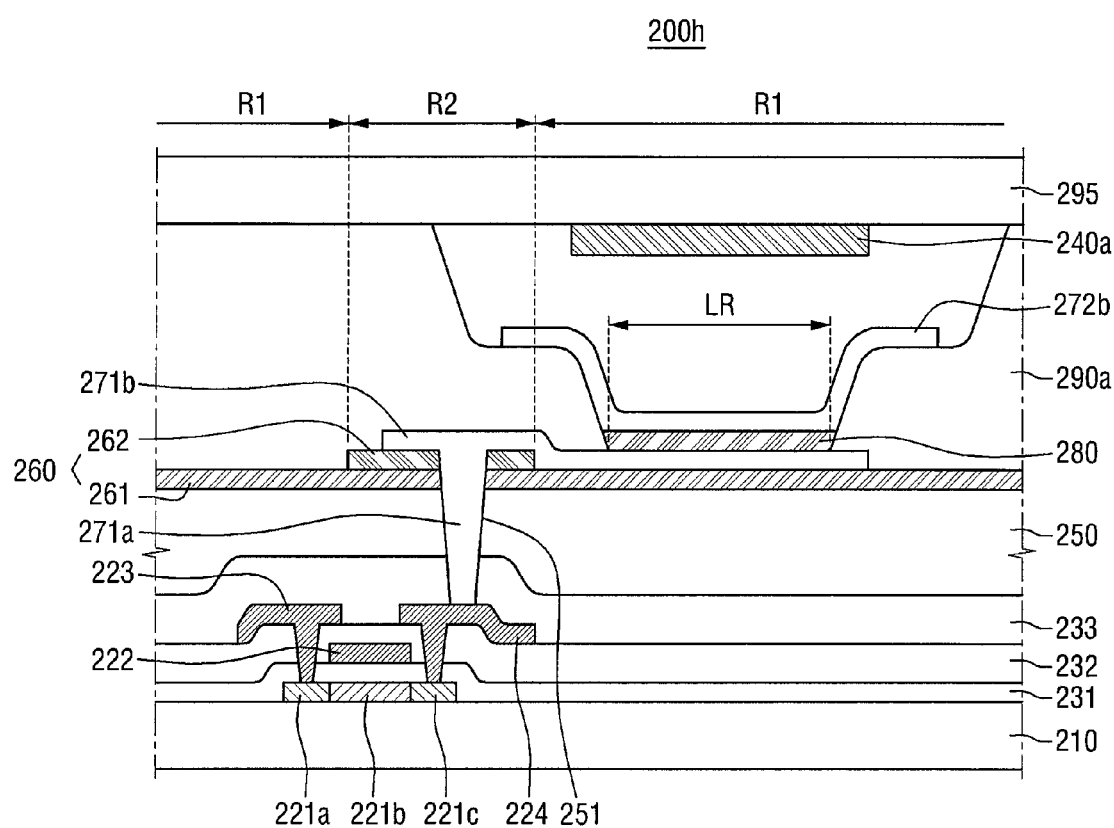
FIG. 10 is a cross-sectional view of an organic EL display panel according to another embodiment of the present invention.

Another embodiment of the present invention will now be described with reference to FIG. 10. FIG. 10 is a cross-sectional view of an organic EL display panel 200h according to another embodiment of the present invention.

Referring to FIG. 10, the organic EL display panel 200h may include a first electrode 271a, a second electrode 272b, a pixel defining layer 290a, an upper substrate 295, and a color filter 240a.

The first electrode 271b may be made of a reflective conductor. When light emitted from an organic light emitting layer 280 reaches the first electrode 271b, the first electrode 271b reflects the light upward.

The second electrode 272b may be made of a transparent conductive material. For example, the second electrode 272b may be made of a material such as ITO, IZO, ZnO, or $SnO_2$.

A region of the pixel defining layer 290a may protrude and thus function as a spacer which supports the upper substrate 295.

The upper substrate 295 may be disposed on the pixel defining layer 290a and may be made of a transparent material. For example, the upper substrate 295 may be made of, but is not limited to, glass, PET, PC, PES, PI or PMMA. Light generated from the organic light emitting layer 280 may pass through the color filter 240a and the upper substrate 295 to come out of the upper substrate 295.

The color filter 240a may be, but is not limited to, a red filter, a blue filter, or a green filter. The color filter 240a may be disposed above a light emitting region LR to overlap the light emitting region LR. In FIG. 10, the color filter 240a is disposed in contact with a bottom surface of the upper substrate 295. However, the present invention is not limited thereto, and the color filter 240a may alternatively be disposed on a path of light emitted from the light emitting layer 280.

For simplicity, other elements substantially identical to those of FIG. 2 are indicated by like reference numerals, and thus their description will be omitted.

According to some embodiments, the organic light emitting layer 280 may be replaced with the organic light emitting layer 280a. In this case, the color filter 240a may be omitted.

According to some other embodiments, a barrier layer 260 may be replaced with one of the barrier layers 260a through 260c of FIGS. 3 through 5.

Embodiments of the present invention provide at least one of the following features.

That is, a layer which blocks outgassing can be reinforced in a region of an organic EL display panel in which outgassing may occur actively.

In addition, the outgassing can be blocked effectively while the effects on color reproducibility of an image displayed on the organic EL display panel are reduced.

However, the effects of the present invention are not limited to the one set forth herein. The above and other effects of the present invention will become more apparent to one of ordinary skill in the art to which the present invention pertains by referencing the claims and their equivalents.

What is claimed is:

1. An organic electroluminescence (EL) display panel comprising:
   a substrate;
   a thin film transistor on the substrate;
   an overcoat layer on the thin film transistor and comprising an organic material;
   a first electrode on the overcoat layer;
   an organic light emitting layer on the first electrode;
   a second electrode on the organic light emitting layer;
   a barrier layer between the overcoat layer and the first electrode, and comprising a first region comprising only a single layer for reducing resonance between the second electrode and the barrier layer, and a second region comprising a multilayer; and
   a pixel defining layer on the barrier layer,
   wherein the second region is not located under a light emitting region in which the light emitting layer is exposed by the pixel defining layer,
   wherein resonance of the first region comprising only the single layer is smaller than resonance of the first region would be if the first region comprised a multilayer.

2. The display panel of claim 1, wherein the first electrode comprises a transparent electrode, and the second electrode comprises a reflective electrode.

3. The display panel of claim 2, wherein of the first region and the second region, only the first region is disposed under the light emitting region.

4. The display panel of claim 3, further comprising a color filter located under the light emitting region and the barrier layer.

5. The display panel of claim 1, wherein the overcoat layer has a contact hole which overlaps the first electrode, and the second region is located adjacently to the contact hole.

6. The display panel of claim 5, wherein the second region is located on an inner surface of a wall of the contact hole.

7. The display panel of claim 1, wherein the barrier layer comprises:
   the single layer at the first region and the second region; and
   the multilayer only at the second region and comprising a different material from the single layer.

8. The display panel of claim 1, wherein the second region comprises a triple or quadruple layer.

9. A display device comprising:
   an organic electroluminescence (EL) display panel; and
   a driver configured to drive the organic EL display panel,
   wherein the organic EL display panel comprises:
      a substrate;
      a thin film transistor on the substrate;
      an overcoat layer on the thin film transistor and comprising an organic material;
      a first electrode on the overcoat layer;
      an organic light emitting layer on the first electrode;
      a second electrode on the organic light emitting layer;
      a barrier layer between the overcoat layer and the first electrode, and comprising a first region comprising only a single layer for reducing resonance between the second electrode and the barrier layer, and a second region comprising a multilayer; and
      a pixel defining layer on the barrier layer,
      wherein the second region is not located under a light emitting region in which the light emitting layer is exposed by the pixel defining layer,
      wherein resonance of the first region comprising only the single layer is smaller than resonance of the first region would be if the first region comprised a multilayer.

10. The display device of claim 9, wherein the first electrode comprises a transparent electrode, and the second electrode comprises a reflective electrode.

11. The display device of claim 10, wherein of the first region and the second region, only the first region is located under the light emitting region.

12. The display device of claim 11, wherein the organic EL display panel further comprises a color filter located under the light emitting region and the barrier layer.

13. The display device of claim 9, wherein the overcoat layer has a contact hole which overlaps the first electrode, and the second region is located adjacently to the contact hole.

14. The display device of claim 13, wherein the second region is located on an inner surface of a wall of the contact hole.

15. The display device of claim 9, wherein the barrier layer comprises:
   the single layer at the first region and the second region; and
   the multilayer only at the second region and comprising a different material from the single layer.

16. The display device of claim 9, wherein the second region comprises a triple or quadruple layer.

* * * * *